United States Patent [19]

Ohmura et al.

[11] 4,401,966
[45] Aug. 30, 1983

[54] MAGNETOELECTRIC TRANSDUCER AND FABRICATION METHOD THEREFOR

[75] Inventors: Kaoru Ohmura, Fuji; Masaru Matsuura, Kurashiki; Takeki Matsui; Takeo Kimura, both of Fuji, all of Japan

[73] Assignee: Asahi Kasei Kogyo Kabushiki Kaisha, Osaka, Japan

[21] Appl. No.: 274,115

[22] Filed: Jun. 16, 1981

[30] Foreign Application Priority Data

Jun. 18, 1980 [JP] Japan .................................. 55-83364

[51] Int. Cl.³ ............................................. H01L 43/02
[52] U.S. Cl. ............................... 338/32 R; 338/32 H
[58] Field of Search ........................ 338/32 R, 32 H; 323/368, 251; 324/252; 29/610 R, 613, , 602, 619, 621, 854–856, 840

[56] References Cited

U.S. PATENT DOCUMENTS

| 3,845,444 | 10/1974 | Masuda et al. | |
| 4,021,767 | 5/1977 | Nonaka et al. | 338/32 H |
| 4,188,605 | 2/1980 | Stout | 338/32 H |
| 4,241,019 | 12/1980 | Nakatani et al. | 73/27 R |

*Primary Examiner*—C. L. Albritton
*Attorney, Agent, or Firm*—Sprung, Horn, Kramer & Woods

[57] ABSTRACT

A mold-packaged magnetoelectric transducer element such as a Hall element or a magnetoresistance element comprises a magnetosensitive thin layer, electrodes formed on the thin layer for lead-out connection, an unwindowed film support, leads formed on one surface of the film support, conductive resin for connecting the electrodes and the leads, mold resin packaging on the one surface of the film support the remaining except parts of the leads.

19 Claims, 10 Drawing Figures

MAGNETOELECTRIC TRANSDUCER AND FABRICATION METHOD THEREFOR

The present invention relates to a magnetoelectric transducer such as a Hall element or a magnetoresistance element and a fabrication method therefor and in particular, a highly reliable, inexpensive and compact magnetoelectric transducer.

Recently, magnetoelectric transducers have been applied to fields of various electronic controllings and especially used as elements for controlling brushless motors for use in record players. Such a trend requires advent of highly reliable, inexpensive and compact magnetoelectric transducers.

Conventionally, however, in fabricating magnetoelectric transducers, transducer elements are inserted into epoxy resin casings one by one, leads are bonded to electrodes of the magnetosensitive portion by soldering, and thereafter a resulting assembly is molded with resin by potting. Such a fabrication process suffers from poor productivity and the resulting transducer lacks sufficient reliability because robustness of the leads is insufficient before molding and the leads are not sealed sufficiently by molding. The poor seal of the leads results from the fact that mold resin hardly enters a gap between the casing and the lead.

To improve productivity in fabrication of compact magnetoelectric transducers, a method has hitherto been proposed as disclosed in Japanese patent application No. 25668/1980 filed by the assignee of the present application, according to which a film is provided which serves as a lead support and a guide for positioning, leads are formed on the film such that their tips or fingers jut out into a window formed in the film, bonding portions of the leads are directly heated so that a magnetoelectric transducer element may be bonded to the fingers by soldering, and thereafter a resulting assembly is molded with resin as applied to the window from opposite sides of the film. This proposal is however disadvantageous because the lead having its finger jutting out into the window in the film is expensive, and the molding applied to the windowed film from opposite sides thereof degrades accuracy of molding and productivity.

An object of this invention is to provide a highly reliable, compact magnetoelectric transducer and a fabrication method therefor.

Another object of this invention is to provide a magnetoelectric transducer which is inexpensive in mass production and which can assure, for mass production, highly accurate positional relation between the center of a magnetosensitive thin layer and mold resin, and a method of fabricating the same.

According to the present invention, leads are formed on an un-windowed film support, electrodes of a transducer element are bonded to the leads on the film support by means of conductive resin, and a resulting assembly is molded with resin as applied from one side of the film support. This ensures a highly reliable, inexpensive and compact magnetoelectric transducer and a simplified fabrication method therefor.

The invention will fully be understood from the following detailed description taken in conjunction with the accompanying drawings in which.

Figure 6:
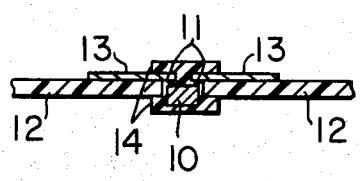
FIG. 6 is a sectional view showing one example of a prior art magnetoelectric transducer.

Prior to describing embodiments of the invention, a structure of a prior art resin-molded packaged magnetoelectric transducer will first be described with reference to FIG. 6. The transducer shown in FIG. 6 comprises a magnetoelectric transducer pellet 10, solder bonds 11, a windowed film 12, leads 13 with a finger deposited on the film, and resin-mold packages 14 as applied from both sides of the windowed film for sealingly enclosing, as a whole, the pellet 10 and the bonds 11 for lead/pellet connection.

Figure 1:
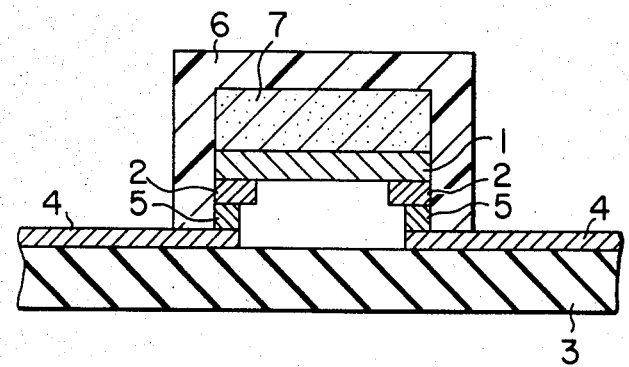
FIGS. 1 to 4 are sectional views showing exemplary discrete components of a magnetoelectric transducer according to the invention.

Referring now to FIG. 1, there is shown one embodiment of a magnetoelectric transducer according to the invention. As shown, lead connecting electrodes 2 are formed on and in part of one surface of a magnetosensitive thin layer 1, leads 4 are formed on one surface of an un-windowed film support 3, and the leads 4 are connected with the lead connecting electrodes 2 by way of conductive resin 5. In the illustrated embodiment, the magnetosensitive thin layer 1 is formed directly on a support substrate 7. Alternatively, a separate magnetosensitive thin film prepared independent of a support substrate may be bonded to this support substrate. The magnetosensitive thin layer 1, lead connecting electrodes 2, conductive resin bond 5, at least portions of the leads 4 connected to the electrodes 2, and substrate 7 are molded by mold resin 6. Thus, the magnetosensitive thin layer 1 is surrounded by the film support 3 on one side and by the mold resin 6 on the other side and protected from the outside.

Involved in the magnetoelectric transducer referred to in this invention are a Hall element and a magnetoresistance element. Generally, the magnetosensitive thin layer 1 used in this invention has a thickness of from 0.1 to 100$\mu$, and semiconductor thin films of any types which have conventionally been used as a magnetoelectric transducing element are available for the magnetosensitive thin layer. The semiconductor thin film includes a single crystalline or polycrystalline body which is reduced in thickness to a thin film by polishing; a thin film prepared by vapor deposition, ion-plating or sputtering; or a thin film prepared by liquid phase or vapor growth process. Especially, a single crystalline thin film or polycrystalline thin film of a III—V group, binary or ternary intermetallic compound semiconductor such as InSb, GaAs, InAs, InAsP or InGaSb is preferably used. Of them, InSb is the most preferable.

The magnetosensitive thin layer 1 is not always integrally formed with the support substrate 7, although it is predominant to form a magnetosensitive thin layer directly on the substrate 7 as shown in FIG. 1 because this layer is very thin. But alternatively, a magnetosensitive thin layer may be bonded to the substrate by using an adhesive. For promoting sensitivity of the transducer, a ferromagnetic material substrate is used as support substrate 7. Specifically, the support substrate 7 may be a ferrite substrate, an alumina substrate, a glass substrate, a heat-resistant resin substrate or a substrate of metal such as iron with surface insulating treatment.

The lead connecting electrode 2 is made of a material which is chosen by taking Fermi level into consideration in view of a material of the magnetosensitive thin layer 1 and which makes ohmic contact to the magnetosensitive thin layer 1, as in ordinary magnetoelectric transducers. For example, with an InSb magnetosensitive thin layer 1, Cu, Au or In is employed for the electrode 2 and for a GaAs magnetosensitive thin layer 1, an electrode of a Ge-Ni-Au alloy is used. The lead connecting electrode may be of a single layer structure or a multi-layer structure, and may be of a suitably sized circular or square configuration, as desired.

For formation of the ohmic contact electrode 2, pattern plating using a plated resist, pattern vapor deposition using a hard mask or pattern vapor deposition based on lift-off method is employed. Heat treatment is added, if necessary. There is available another ohmic contact electrode formation technology as disclosed in U.S. Pat. No. 4,296,424 issued Oct. 20, 1982. The thickness of the electrode 2 is comparatively insignificant, but usually 0.005 to 20$\mu$ and preferably 0.01 to 10$\mu$.

It is desirable that the lead 4 formed on the un-windowed film support 3 can be fabricated at low cost and can be integral with the film support 3. To this end, the film support 3 may preferably be a heat-resistant and humidity-proof film such as a polyamide film, a polyamideimide film, a polyparabanic acid film, a triazin film, or an epoxy film. Of them, the polyimide, polyamideimide and polyparabanic acid films are especially preferable. The thickness of the film support 3 is comparatively insignificant but usually 10 to 300$\mu$ and preferably 20 to 200$\mu$. A material suitable for the lead 4 is a metal of high electrical conductivity such as copper, silver or tin and preferably, copper. The thickness of the lead 4 is also comparatively insignificant, but usually 5 to 100$\mu$. Especially, 10 to 50$\mu$ thickness is preferred in consideration of the flexibility of film support 3 serving as a carrier tape and the reliability of transducer which depends on the thickness of the film support and leads.

The leads 4 can be formed on the film support 3 in various known manners. For example, an electrically conductive metal layer is formed on the film support 3 and selectively etched to obtain a desired pattern of leads, or an electrically conductive metal layer of a desired lead pattern is formed on the film support 3 by selective plating based on additive method.

As described above, a desired pattern of the leads 4 can be formed on the film support 3 with high accuracy and the leads 4 can be dimensioned stably, in other words, the positional relationship between the leads can be dimensioned fixedly. Consequently, by using the leads 4 secured to the film support, the film support 3 can serve as a positional reference, thereby ensuring highly accurate fabrication of the magneto-electric transducer according to the invention. In other words, the film support is formed with perforations for engagement with a sprocket, and is fed by means of the sprocket to maintain a fixed positional relation of the fixed pattern leads on the film support with respect to a transducer pellet which is fed from a predetermined position to the film support, thereby ensuring self-alignment of the transducer pellet. When the lead 4 is made of copper or the like, it may be coated with an oxidization protection film of gold, silver, tin, solder or the like. The lead of silver or tin dispenses with a protection film.

The conductive resin 5 is adapted to connect the lead connecting electrode 2 to the lead 4 and typically, an electrically conductive resin paste stands for the conductive resin. Such a resin paste is commercially available or homemade as desired, and is preferred to be treated at low temperatures and to have excellent heat resistant and humidity-proof properties. Specifically, a resin paste containing fine powder of a metal such as Au, Ag, Cu, Pd or solder, especially Ag fine powder dispersed in a binder such as epoxy resin, polyamideimide resin or polyimide resin is preferably used. Especially, as the binder, polyamideimide resin is referred which is soluble in organic solvents. Of binder materials set forth above, expoxy resin is well known and a conductive epoxy resin paste such as "Epotec" sold by Epoxy-technology Incorp. or "5504" sold by Dupont is available.

Preferably, the mold resin is required to have excellent heat resistant and humidity-proof properties. In particular, used as the mold resin is epoxy resin, silicone resin, polyamideimide resin, or polyimide resin. Preferably, an inorganic material such as alumina is dispersed in the resin mentioned above. Especially, it is preferable to use a two-layer mold resin of elastic silicone resin and epoxy resin or of polyamideimide resin having a low humidity permeable coefficient and epoxy resin.

It is sufficient that the magnetosensitive thin layer 1, lead connecting electrodes 2 and at least a part of each lead 4 are enclosed by the mold resin 6. Before molding, the magnetosensitive thin layer 1 may be coated with a passivation film by sputtering or vapor depositing $SiO_2$, $Al_2O_3$ or the like.

Figure 2:
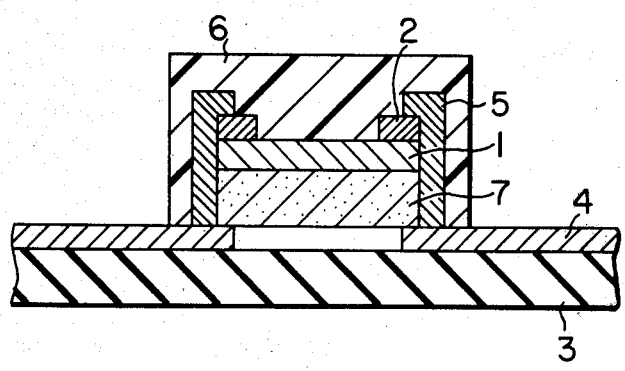
Figure 3:
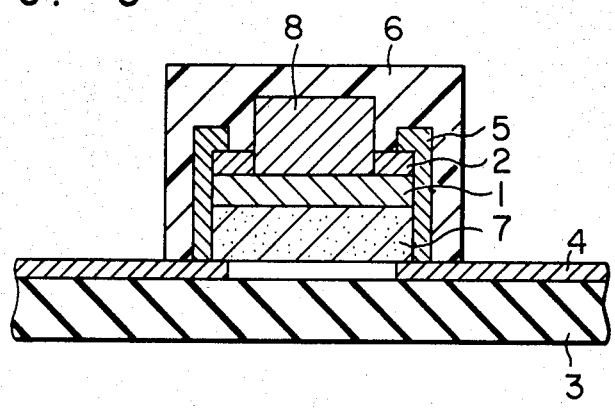

The magnetosensitive thin layer 1 formed on the support substrate is mounted to the film support 3 with the surface of the magnetosensitive thin layer 1 carrying the electrodes 2 faced toward the film support 3 as shown in FIG. 1. In an alternative, the support substrate 7 may oppose the film support 3 as shown in FIGS. 2 and 3. In FIG. 3, a flux concentrating ferromagnetic chip 8 abuts against the surface of the magnetosensitive thin layer 1 carrying the electrodes 2 to improve sensitivity, and the mold resin 6 is applied to enclose the chip 8.

In fabricating the magnetoelectric transducer according to the invention, the magnetosensitive thin layer 1 provided in part with the lead connecting electrodes 2 and the leads 4 formed on the unwindowed film support 3 are first prepared. Especially, in fabricating a number of magnetoelectric transducers simultaneously, a number of leads 4, corresponding to the number of transducers to be fabricated, are aligned on the film support 3 at a predetermined spacing in the longitudinal direction of the film support 3. For easy positioning, the film support 3 is formed with perforations 9 for engagement with a sprocket and a predetermined position of the perforation relative to the lead 4 is established.

Figure 5A:
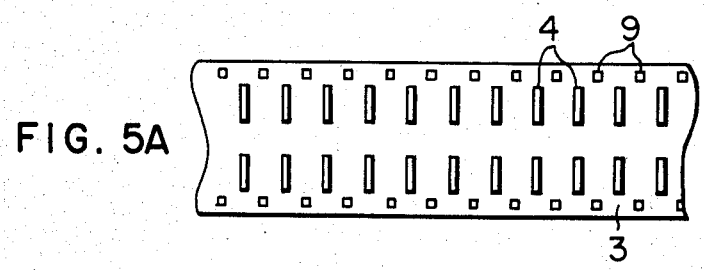
FIGS. 5A to 5E are plan views useful in explaining bonding and molding steps in fabrication of a four-terminal magnetoelectric transducer according to the invention.
Figure 5B:
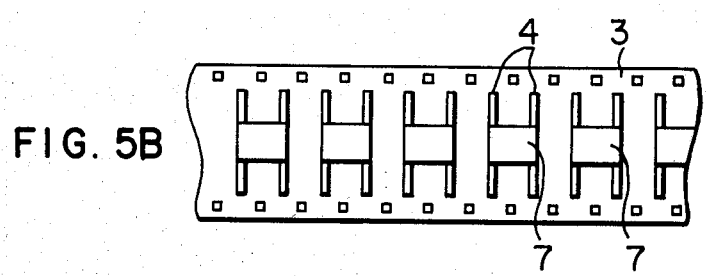

Then, the lead connecting electrodes 2 formed in part of the magnetosensitive thin layer 1 are positioned to the leads 4 formed on the unwindowed film support 3 and they are connected together by means of the conductive resin, as shown in FIG. 5B. The positioning is carried out by manipulating a unit for adjusting fine position of the lead or the transducer pellet while monitoring through a magnifying monitor. In this case, the support substrate 7 is labelled with marks indicative of the position of the electrode. FIG. 5B is an illustration as viewed from the support substrate 7. While in FIG. 1 the lead 4 and the lead connecting electrode 2 opposing thereto are electrically connected, the magnetosensitive thin layer is interposed, as shown in FIGS. 2 and 3, between the lead 4 and the lead connecting electrode 2 which are electrically connected together. In the case of the transducer as shown in FIG. 1, solder bonding is not performed suitably because local heating for fusing solder is difficult. If the overall assembly is heated, the magnetosensitive thin layer, especially made of a compound semiconductor, undergoes adverse changes in film characteristics under high temperature treatment. In the case of the transducers as shown in FIGS. 2 and 3, it is difficult to electrically connect the electrode 2 to the lead 4 by using solder which runs past the side surface of the support substrate. These problems are solved by the electrical connection of conductive resin 5, thus providing a highly reliable, inexpensive and compact magnetoelectric transducer.

When the electrode 2 faces the lead 4 as shown in FIG. 1, the conductive resin 5 is applied to the lead 4 and/or the electrode 2 by a suitable amount for bonding and thereafter, subjected to a necessary heat treatment. When effecting bonding between the electrode 2 and the lead 4 with the support substrate 7 opposed to the film support 3 as shown in FIG. 2, the conductive resin 5 is applied by using a tool so as to run past the side surface of the support substrate 7 thereby to bridge the electrode 2 and the lead 4, and thereafter subjected to a necessary heat treatment, thereby completing the electrical connection between the electrode 2 and the lead 4. Practically, the application of the conductive resin is monitored through a magnifying monitor and the position of the tool is adjusted precisely by means of an X, Y-axis adjuster unit. The flux concentrating chip 8 as shown in FIG. 3 may be applied either before or after connecting the lead 4 to the electrode 2 by conductive resin 5. This chip 8 is bonded to the magnetosensitive thin layer by using silicone resin.

Figure 5C:
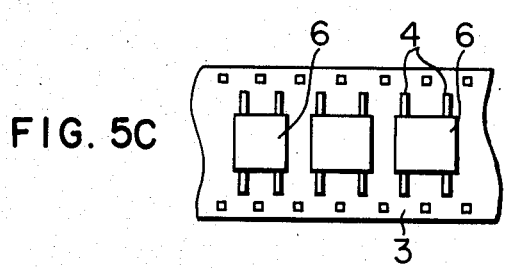
Figure 5D:
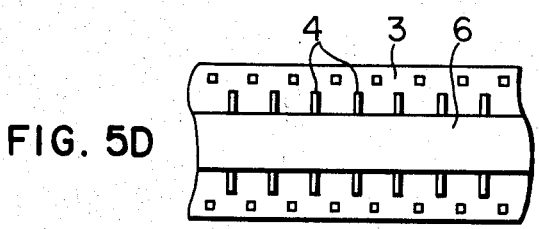
Figure 5E:
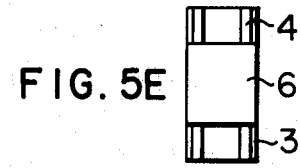

The magnetosensitive thin layer 1 thus connected to the leads 4 on the film support 3 is molded with mold resin 6. For molding with mold resin 6, die casting is effected on the side of the film support 3 carrying the magnetosensitive thin layer 1, or a mold material in the form of a casing is bonded by thermal compression or adhesive to the surface of the film support 3 carrying the magnetosensitive thin layer 1. In fabricating a number of magnetoelectric transducers, the individual transducers may be molded with mold resin 6 separately as shown in FIG. 5C or alternatively, a plurality of elements may be molded with continuous mold resin 6 in common as shown in FIG. 5D. After completing molding as shown in FIG. 5C or 5D, the film support 3 is cut into discrete transducers.

Figure 4:
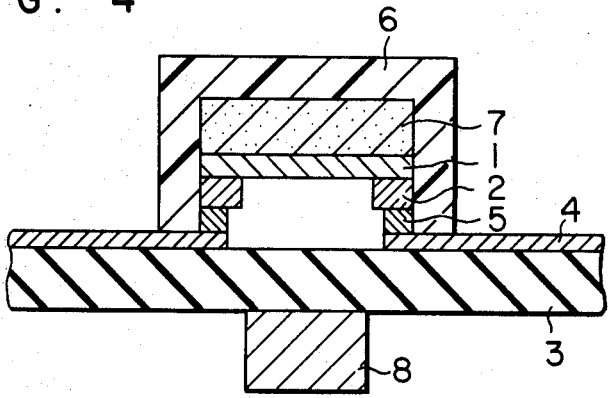

FIG. 4 shows another modified embodiment wherein one surface of the magnetosensitive thin layer 1 carrying the electrodes 2 opposes the film support 3 as in the embodiment of FIG. 1, and the flux concentrating chip 8 is fixed to the other, opposite surface of film support 3 so as to oppose the magnetosensitive thin layer 1 via the film support 3. This modification is advantageous when there is no space sufficient to accommodate the flux concentrating chip between the film support 3 and the magnetosensitive thin layer 1. The flux concentrating chip 8 may be applied to the film support 3 either before or after molding with mold resin 6.

As described above, according to the invention, bonding and molding can be performed on the tape-shaped film support called a tape carrier, provided with leads and the molding can be effected on one side of the film support, so that productivity can be improved. Further, since the leads are integral with the film support, these leads can be very robust to handle. Moreover, since the leads are in intimate contact with the film support to exclude a gap into which mold resin penetrates, these leads assure high grade seal after molding, thus providing a highly reliable, inexpensive and compact magnetoelectric transducer.

The following examples are to enhance understanding of the foregoing embodiments and the invention should not be limited to those examples.

EXAMPLE 1

An InSb thin layer of 1 $\mu$m thickness having an electron mobility of 15,000 $cm^2/V$ sec was formed on a smoothed surface of a 55 mm diameter mica by vapor deposition. The InSb thin layer was coated with epoxy resin "ME-264" manufactured by Pelnox Japan and bonded to a square ferrite substrate of Ni-Zn system having a 0.3 mm thickness and a 37 mm side. The mica was then removed. Next, surface portions of the InSb thin layer on the ferrite wafer substrate which was reserved for electrodes were deposited with a 1.0 $\mu$m thickness copper layer by electroless plating through photolithography process using microphotoresist manufactured by Kodak. Thus, a copper electrode pattern was prepared. Thereafter, the photolithography process using microphotoresist was again employed to form a magnetosensitive pattern, whereby unwanted InSb was removed by etching using an aqueous solution of hydrochloric acid and ferric chloride. Thus, a magnetosensitive portion and four electrodes of a Hall element were prepared. The ferrite wafer thus prepared was cut by a die cutter to obtain a square Hall element pellet of a 1.4 mm side. On the other hand, copper foil leads each having a tip width of 200 $\mu$m and a thickness of 35 $\mu$m were formed on a 75 $\mu$m thick polyimide film called "Kapton" manufactured by Dupont. A polyamideimide base silver paste prepared by admixing polyamideimide, produced from metaphenylene-diamine and anhydrous trimellitic acid chloride and soluble in organic solvents, with 1.8 $\mu$m size silver fine powder at 1:9 weight ratio and adding dimethylacetamide was applied to bonding portions of the copper foil leads so as to connect the electrodes of the Hall element pellet opposing the leads to these leads, and was subjected to heat treatment at 150° C. for 30 minutes, thereby completing bonding. Subsequently, a teflon die was placed on the side of the "Kapton" polyimide film carrying the Hall element pellet, and the Hall element pellet and portions of the leads were molded with epoxy resin "ME-264" manufactured by Pelnox Japan under heat treatment at 150° C. for 15 hours. Thereafter, the film support was cut by a die cutter to obtain the individual Hall element. The thus fabricated Hall element had an input resistance of 350 $\Omega$ and a product sensitivity of 30 mV/mA·KG. After the element was immersed in boiling water for 10 hours, the resistance and the product sensitivity remained unchanged, proving high reliability. These excellent properties of the Hall element is considered to be attributable to heat resistant and humidity-proof properties of the electrodes and the bonding portions of the leads.

EXAMPLE 2

This example is applied to a magnetoresistance element as a discrete component.

A 4 mm length and 0.4 mm width InSb vapor-deposition layer having an electron mobility of 28000 $cm^2/V$ sec was formed on a 0.5 mm thickness, 1 mm width and 2.5 mm length ferrite substrate. Gold was vapor deposited, in 0.1 $\mu$m thickness to the InSb layer through lift-off method using microphotoresist manufactured by Kodak to form a desired pattern of short bar electrodes having each a width of 50 μm and spaced apart from each other at a distance of 50 μm and to form electrodes for external connection each having a width of 0.4 mm and a length of 0.5 mm at opposite ends of the InSb layer. On the other hand, copper foil leads each having a tip width of 200 μm and a thickness of 35 μm were formed on a 75 μm thick Kapton polyimide film. Thus, the magnetoresistance element pellet was placed on the leads with the substrate faced toward the leads. Next, the external connection electrodes and the leads were connected by a conductive resin paste "Epotic H-31D" manufactured by Epoxytechnology Incorp. which runs past the side of the substrate and the conductive resin paste was heat treated at 150° C. for 30 minutes to complete bonding. Subsequently, an alumina dispersed polyamideimide solution prepared by admixing polyamideimide, produced from metaphenylenediamine and anhydrous trimellitic acid chloride and soluble in organic solvents, with 5 μm size alumina fine powder at 1:9 weight ratio, and adding dimethylacetamide was dropped onto the magnetoresistance element pellet and heat treated at 150° C. for 30 minutes. Thereafter, an epoxy resin casing was bonded to the surface of the Kapton polyimide film carrying the magnetoresistance element pellet by a phenol resin family adhesive "Bostik XA564-4" manufactured by Bostik Japan and heat treated at 150° C. for 30 minutes to complete molding. The thus fabricated magnetoresistance element exhibited a 60% change in resistance under the application of magnetic field of 3 KG flux density. After the element was immersed in boiling water for 10 hours, the resistance remained unchanged, proving high reliability.

EXAMPLE 3

This example shows a Hall element similar to Example 1.

An InAs polycrystalline wafer having an electron mobility of 10000 cm$^2$/Vsec was bonded to a square ferrite wafer substrate of Ni-Zn system having a 0.3 mm thickness and a 37 mm side by an epoxy resin "ME-264" manufactured by Pelnox Japan. Next, only desired surface portions of the InAs wafer on the ferrite wafer substrate were deposited with a 1.0 μm thick copper layer by electroless plating through photolithography process using microphotoresist manufactured by Kodak. Thereafter, the photolithography process using microphotoresist was again employed to form a desired magneto-sensitive pattern and four electrodes of the Hall element while removing unwanted InAs by etching. The ferrite wafer thus prepared was cut by a die cutter to obtain a square Hall element pellet of a 1.4 mm side. On the other hand, leads of copper foil with 1 μm thick electroless-plated silver coating each having a tip width of 200 μm and a thickness of 35 μm were formed on a 75 μm thick polyparabanic acid film "Tradron" manufactured by Shell Chemical Co. The Hall element pellet was placed on the leads with the substrate faced toward the leads, and the external connection electrodes and the leads were connected by a polyamideimide based silver paste which runs past the side of the substrate and the silver paste was heat treated at 150° C. for 30 minutes to complete bonding, the silver paste being prepared by admixing polyamideimide, produced from metaphenylenediamine and anhydrous trimellitic acid chloride and soluble in organic solvents, with 1.8 μm size silver fine powder at 1:9 weight ratio, and adding dimethylacetamide. Subsequently, a teflon die was placed on the surface of the tradron film carrying the Hall element, and the Hall element pellet and portions of the leads were molded with silicon resin "JCR 6101" manufactured by Toraysilicone under heat treatment at 150° C. for 2 hours and thereafter with epoxy resin "ME-264" manufactured by Pelnox Japan under heat treatment at 150° C. for 15 hours. The film support was then cut by a die cutter to obtain the individual Hall element. The thus fabricated Hall element had an input resistance of 400 Ω and a product sensitivity of 20 mV/mA·KG. After the element was immersed in boiling water for 10 hours, the resistance and the product sensitivity remained unchanged, proving high reliability.

EXAMPLE 4

This example is a modification of Example 2 and the manner to carry the element pellet is different.

A 4 mm length and 0.4 mm width InSb vapor-deposition layer having an electron mobility of 28000 cm$^2$/Vsec was formed on a 0.5 mm thickness, 1 mm width and 2.5 mm length ferrite substrate. Gold was vapor deposited, in 0.1 μm thickness, to the InSb layer through lift-off method using microphotoresist manufactured by Kodak to form a desired pattern of short bar electrodes having each a width of 50 μm and spaced apart from each other at a distance of 50 μm and to form external connection electrode portions each having a width of 0.4 mm and a length of 0.5 mm at opposite ends of the InSb layer. In this manner, a magnetoresistance element carrier pellet was prepared. On the other hand, leads of copper foil with 1 μm thick electroless-plated silver coating each having a tip width of 200 μm and a thickness of 35 μm were formed on a 75 μm thick polyparabanic acid film "Tradron" manufactured by "Shell Chemical Co.". A conductive resin paste "5504" manufactured by Dupont was applied to bonding portions of the leads, and the leads and the electrode portions of the magnetoresistance element pellet were connected by the conductive resin paste with the electrode portions faced toward the leads and the conductive resin paste was heat treated at 150° C. for 1 hour to complete bonding. Next, in advance of resin molding, a pre-treatment was carried out in which polyimide solution prepared by adding dimethylacetamide to polyimide produced from 4,4'-di(m-aminophenoxy)dipehenylsulfone and3-3'-4,4'-diphenylethertetracarboxylic acid dianhydride and soluble in organic solvents was dropped onto the magnetoresistance element pellet and thereafter heat treated at 150° C. for 30 minutes. This pre-treatment was effective to promote humidity-proof property. Thereafter, an epoxy resin casing was bonded to the surface of the tradron film carrying the magnetoresistance element pellet by a phenol resin family adhesive "Bostik XA564-4" manufactured by Bostik Japan and heat treated at 150° C. for 30 minutes to complete molding. The thus fabricated magnetoresistance element exhibited a 60% change in resistance under the application of magnetic field of 3 KG flux density. After the element was immersed in boiling water for 10 hours, the resistance remained unchanged, proving high reliability.

EXAMPLE 5

This example intends to provide a Hall element of excellent temperature characteristics.

A GaAs single crystalline wafer having an electron mobility of 4000 cm$^2$/Vsec was bonded to a square ferrite substrate of Ni-Zn system having a 0.3 mm thickness and a 37 mm side by an epoxy resin "ME-264" manufactured by Pelnox Japan. Next, only desired surface portions of the GaAs wafer were deposited with Ge-Ni-Au alloy in 0.1 μm thickness by sputtering through lift-off method using microphotoresist manufactured by Kodak. Thereafter, through photolithography process using again the photoresist, unwanted GaAs was etched and removed to form a desired magnetosensitive pattern and four electrodes of the Hall element. The ferrite wafer thus prepared was cut by a die cutter to obtain a square Hall element pellet of a 1.4 mm side. On the other hand, a 100 μm thick film of polyamideimide produced from 4,4'-diaminodiphenylether and anhydrous trimellitic acid chloride was formed to prepare a tape carrier which is formed with perforations for feed with a sprocket. Leads of copper foil with 1 μm thick tin coating each having a tip width of 200 μm and a thickness of 35 μm were formed on the carrier. A polyimide base silver paste prepared by admixing polyimide, produced from 4,4'-di(m-aminophenoxy)diphenylsulfone and 3,3',4,4'-diphenylethertetracarboxylic acid dianhydride and soluble in organic solvents, with 1.8 μm size silver fine powder at 1:9 weight ratio and adding dimethylacetamide was applied to bonding portions of the copper foil leads so as to connect the electrodes of the Hall element pellet opposing the leads to these leads, and was subjected to heat treatment at 150° C. for 30 minutes, thereby completing bonding. Subsequently, a teflon die was placed on the surface of the polyamideimide tape carrier carrying the Hall element pellet, and the Hall element pellet and portions of the leads were molded with epoxy resin "ME-264" manufactured by Pelnox Japan under heat treatment at 150° C. for 15 hours. Thereafter, the film support was cut by a die cutter to obtain the individual Hall element. The thus fabricated Hall element had an input resistance of 500 Ω and a product sensitivity of 10 mV/mA·KG. After the element was immersed in boiling water for 10 hours, the resistance and the product sensitivity remained unchanged, proving high reliability.

What is claimed is:

1. A magnetoelectric transducer comprising:
   a magnetosensitive thin layer;
   lead connecting electrodes formed on and in part of the magnetosensitive thin layer;
   an unwindowed film support carrying, on one side thereof, said electrodes and thin layer;
   leads formed on the film support on the one side thereof;
   conductive resin applied on the leads, for connecting said leads and said lead connecting electrodes; and
   sealing mold resin applied on the one side of said film support, for molding said magnetosensitive thin layer, said lead connecting electrodes, portions of said leads, and said conductive resin, said mold resin connecting to said film support.

2. A magnetoelectric transducer according to claim 1 wherein said magnetosensitive thin layer comprises a thin layer selected from the group consisting of InSb, GaAs, InAs, InAsP and InGaSb.

3. A magnetoelectric transducer according to claim 1 wherein said unwindowed film support comprises a film selected from the group consisting of a polyimide, polyamideimide, polyparabanic acid, triazine film, and epoxy film.

4. A magnetoelectric transducer according to claim 1 wherein said lead is made of a member selected from the group consisting of copper, silver and tin.

5. A magnetoelectric transducer according to claim 1 wherein said conductive resin comprises a member selected from the group consisting of an epoxy resin, polyamideimide, and polyimide binder and fine powder selected from the group consisting of Au, Ag, Cu, Pd and solder dispersed in the binder.

6. A magnetoelectric transducer according to claim 1 wherein said mold resin is made of a member selected from the group consisting of epoxy resin, silicone resin, polyamideimide and polyimide.

7. A magnetoelectric transducer according to claim 1 wherein said magnetosensitive thin layer is formed on a ferromagnetic support substrate.

8. A magnetoelectric transducer according to claim 1 wherein said magnetosensitive thin layer is formed on a member selected from the group consisting of a ferrite support substrate, an alumina support substrate, a glass support substrate, a heat resistant resin support substrate and a metal support substrate with insulating surface treatment.

9. A magnetoelectric transducer according to claim 8 wherein said thin layer carried on the support substrate is disposed on the one side of said film support with said support substrate interposed between said thin layer and said film support.

10. A magnetoelectric transducer according to claim 8 wherein said thin layer carried on the support substrate directly opposes the surface of said film support.

11. A magnetoelectric transducer according to claim 9 which further comprises a flux concentrating ferromagnetic material layer disposed on said thin layer.

12. A magnetoelectric transducer according to claim 10 which further comprises a flux concentrating ferromagnetic material layer disposed on the other side of said film support to oppose said thin layer.

13. A resin-mold packaged magnetoelectric transducer comprising:
   (a) a magnetosensitive thin layer;
   (b) lead connecting electrodes formed on and in part of the magnetosensitive thin layer;
   (c) leads to be connected to the electrodes for external lead;
   (d) an unwindowed film support carrying, on one side thereof, said electrodes and thin layer, said leads being integral with the film support and held in a predetermined positional relationship with respect to the film support, one surface of said thin layer being protected by the film support;
   (e) conductive resin applied on the leads, for connecting said leads and said lead connecting electrodes; and
   (f) mold resin applied on the one side of said film support, for molding said magnetosensitive thin layer, said lead connecting electrodes, portions of said leads, and said conductive resin, said mold resin connecting to said film support.

14. A transducer according to claim 13 wherein said magnetosensitive thin layer constitutes a pellet which is formed on a ferromagnetic support substrate.

15. A resin-mold packaged magnetoelectric transducer comprising a magnetosensitive thin layer pellet, lead connecting electrodes formed on and in part of the magnetosensitive thin layer, a film support for supporting leads, leads formed on one surface of the film support, means for connecting the leads and said electrodes, and sealing mold resin for molding said thin layer pellet, said lead connecting electrodes, portions of said leads, and said connecting means, said mold resin connecting to said film support, characterized in that said film support comprises an unwindowed film protecting said thin layer pellet, that said leads are formed on the unwindowed film integrally therewith, that said connecting means comprises conductive resin, and that said thin layer pellet, lead connecting electrodes, leads and electrode/lead connecting conductive resin are disposed on one side of said unwindowed film support, and sealed with said mold resin as applied only on the one side of said film support.

16. A method of fabricating a magnetoelectric transducer comprising the steps of:
forming lead connecting electrodes on and in part of a magnetosensitive thin layer pellet;
forming leads on an unwindowed film support;
connecting said electrodes and leads by conductive resin as applied to the surface of said film support carrying said leads so that said magnetosensitive thin layer pellet is carried on said film support; and
molding and fixing said magnetosensitive thin layer pellet, said lead connecting electrodes, portions of said leads and said conductive resin with mold resin as applied on the side of said film support carrying said magnetosensitive thin layer pellet.

17. A fabrication method according to claim 16 which further comprises applying electrode position indicator marks on said pellet, for positioning said lead connecting electrodes and said leads formed on said unwindowed film support.

18. A method of fabricating a mold-packaged magnetoelectric transducer comprising the steps of:
(a) forming lead connecting electrodes on and in part of a magnetosensitive thin layer pellet and feeding the pellet to a predetermined position;
(b) preparing a tape carrier of an unwindowed film, forming leads on one surface of the film integrally therewith, and feeding the tape carrier to said predetermined position by using sprocket perforations formed in the tape carrier;
(c) positioning the electrodes on said pellet and the leads on said film and connecting these electrodes and leads by conductive resin; and
(d) molding and fixing said pellet, said electrodes, portions of said leads and said conductive resin with insulating resin as applied on the side of said film carrying said pellet.

19. A fabrication method according to claim 16 which further comprises positioning marks coincident with said pellet on said film support, for positioning said lead connecting electrodes and said leads formed on said unwindowed film support.

* * * * *